United States Patent [19]
Engler

[11] Patent Number: 6,158,833
[45] Date of Patent: Dec. 12, 2000

[54] FIRE-RESISTANT COMPUTER STORAGE APPARATUS

[75] Inventor: Randolph L. Engler, Lafayette, Ind.

[73] Assignee: Schwab Corporation, Lafayette, Ind.

[21] Appl. No.: 09/394,462

[22] Filed: Sep. 11, 1999

[51] Int. Cl.$^7$ .................................................... E04B 2/00
[52] U.S. Cl. .............................. 312/409; 109/83; 109/84
[58] Field of Search ................................ 109/80, 82, 83, 109/84, 85; 312/223.1, 400, 409, 296, 410, 223.6; 454/184; 220/560.01, 4.02

[56] References Cited

U.S. PATENT DOCUMENTS

| | | | |
|---|---|---|---|
| 3,559,594 | 2/1971 | Miller | 109/84 |
| 4,048,926 | 9/1977 | Brush, Jr. et al. | |
| 4,176,440 | 12/1979 | Lichter. | |
| 4,408,545 | 10/1983 | Lichter. | |
| 4,441,766 | 4/1984 | Hess | 312/409 X |
| 4,495,780 | 1/1985 | Kaneko et al. | |
| 4,685,303 | 8/1987 | Branc et al. | |
| 4,685,402 | 8/1987 | Nelson et al. | 312/409 X |
| 4,688,493 | 8/1987 | Brush, Jr. et al. | |
| 4,712,490 | 12/1987 | Lichter. | |
| 4,831,476 | 5/1989 | Branc et al. | |
| 4,980,786 | 12/1990 | O'Sullivan et al. | |
| 5,152,231 | 10/1992 | Preston et al. | |
| 5,160,357 | 11/1992 | Faber | 220/4.02 X |
| 5,295,447 | 3/1994 | Robbins et al. | |
| 5,377,514 | 1/1995 | Robbins et al. | |
| 5,623,597 | 4/1997 | Kikinis. | |

FOREIGN PATENT DOCUMENTS

| | | | |
|---|---|---|---|
| 23621 | 2/1981 | European Pat. Off. | 109/82 |

*Primary Examiner*—Janet M. Wilkens
*Attorney, Agent, or Firm*—Locke Reynolds LLP

[57] ABSTRACT

A thermally insulated cabinet is provided for protecting electronic data storage devices from damage by accidental and environmental conditions and from intentional acts. This cabinet provides an interior envelope which contains a data storage device surrounded by multiple layers of thermal insulation. The thermal insulation layers allow electrical power, data and device control cabling to access the device, thus permitting real time operation of the device while the device is contained within the inner envelope. The inner envelope has two vertically separated ends: a lower end and an upper end. The data storage device is affixed to the inner envelope to permit heated air to rise from the lower end of the inner envelope away from the location of the device. The inner chamber is dimensioned to permit the heat generated by operation of the data storage device to dissipate and to maintain stable thermal conditions within the inner envelope during normal use. A tortuous path exists through thermal insulation to accommodate various electrical power, data and control cables that must be connected to the device to permit to the data storage device to function. In one embodiment, a serpentine path is provided for the cables. The serpentine path substantially increases the thermal energy that can by released by the control wires into the thermal insulators and reduces the risk that these wires will conduct sufficient thermal energy from the outside of the cabinet to damage the data storage device.

19 Claims, 3 Drawing Sheets

FIRE-RESISTANT COMPUTER STORAGE APPARATUS

BACKGROUND OF THE INVENTION

1. Field of the Invention

The present invention is directed to an apparatus for protecting computer storage equipment such as disk drives, tape drives and solid state devices from damage or destruction in the event of a fire. The invention is particularly directed to specially configured cabinetry allowing the continuous operation of computer storage equipment that will dissipate the heat normally generated during such continuous operation and will protect such equipment including the storage media in the event of a fire.

2. Description of the Prior Art

The traditional means to preserve documents and tangible things of value is to store them in a secured location. Although many types of storage locations and containers exist, the most common is the fire-resistant computer storage apparatus.

The defining characteristic of any fire-resistant computer storage apparatus is its ability to insulate the items contained within it from theft, accidental or unauthorized destruction, damage or modification. To protect against theft or unauthorized access, fire-resistant computer storage apparatus surround the protected items with barrier materials such as concrete and steel and provide complex locking systems. Similarly, to protect items from damage in the event of a fire, it is common that fire-resistant computer storage apparatus provide sealed spaces surrounded by materials having low levels of thermal conductivity. Examples of such fire-resistant computer storage apparatus include, Robbins et al., U.S. Pat. Nos. 5,295,447 and 5,377,514 and Lichter, U.S. Pat. Nos. 4,712,490 and 4,176,440.

However, these designs contemplate a preservation scheme in which a document or tangible thing is placed within a storage vault for later retrieval. Accordingly, users of the fire-resistant computer storage apparatus cannot use, access or update information contained within the fire-resistant computer storage apparatus, without opening the fire-resistant computer storage apparatus.

Increasingly, modern businesses rely upon computer and other electronically generated data as the preferred method for processing and preserving information. Data in this form is easier to capture, store, use, and exchange than data that is recorded on printed documents. Importantly, data that is stored in electronic form permits businesses to make decisions and execute transactions based upon "real-time" information that actually reflects current conditions.

As electronic commerce and other Internet transactions become more important to businesses, the need to secure, preserve and protect "real-time" electronic data grows more imperative. However, the principal forms of electronic storage, optical or disk media, tapes and solid state devices are all relatively vulnerable to casualty damage and are particularly sensitive to damage through exposure. Environmental extremes such as fire, heat, or contamination can damage these devices and can result in the corruption or wholesale loss of vital business information. Accordingly, businesses have developed a variety of approaches to protect their data. One popular solution involves the purchase of additional, and duplicative, storage arrays that are located in separate places. However, the use of redundant arrays is costly and increases the maintenance burden associated with data storage.

Another solution involves periodically "backing up" or preparing a copy of important data on tapes, disks or portable solid state devices. The copy is then stored in a location where it is less likely to be damaged. Traditional fire-resistant computer storage apparatus are often used to store such "back up" copies and provide excellent protection against fire damage, contamination, theft or mutilation.

However, the preparation and storage of "back-up" information is a time-consuming task. Further, such "back-up" copies depict the contents of the business' electronic database as of the moment that the "back up" is made. In the event that that a business' normal storage media is damaged or destroyed, the business will be unable to recover, electronically, any data recorded by the business between the time that the "back up" is made and the time that the storage media was damaged.

This creates a conflict for business owners. The owner must balance the costs associated with the risk of lost data against the costs of making and securing "back ups." Typically, this balance results in a periodic "back up" system in which "back ups" are made on a monthly, weekly or daily basis. Under this system, the owner inherently accepts the risk that important information may be lost if significant transactions occur between the time that a backup is made and the time that the owner's data storage media is damaged or destroyed.

Accordingly, to reduce the costs of "back ups" and to lower the risk of lost data, what is necessary is a storage cabinet that preserves and protects electronic data storage devices from accidental, environmental and other damage yet allows the data storage device to operate in real-time.

Meeting this necessity has proven difficult, as there are two principal technical challenges that must be overcome. The data storage device must have adequate protection against thermal and environmental extremes. This typically involves locating the device inside a container or cabinet which is equipped with an inner space. This inner space is surrounded by a thermal insulator and sealed against the possibility that heated gasses or environmental contaminants will enter. In order to provide appropriate thermal protection, it is necessary that the thermal insulator be a poor thermal conductor.

When an active component such as a disk drive is stored in such an inner chamber, the drive itself creates heat that must be dissipated. However, a sealed thermal insulator surrounds the drive. Thus, the thermal insulation used to protect the drive from external heat damage also works to prevent dissipation the heat generated by operation of the drive itself. If the heat is not adequately dissipated, the temperature in the inner space will rise and potentially damage the storage device. Thus, a first technical challenge is to design a thermally insulated container to protect a data storage device while still providing an adequate mechanism for the dissipation of the heat generated by the device.

This problem has been addressed in various ways by the prior art. One solution provides cabinetry for data storage media that features an integral air conditioning system to control the temperature of the area enclosing the data storage device. Another solution involves cabinetry containing apparatus to defeat the insulation during normal conditions.

Branc et al., U.S. Pat. No. 4,585,303 and Koneko et al., U.S. Pat. No. 4,495,780 both disclose cabinetry that use environmental controls to maintain the temperature of active electronic devices containers within the cabinet. Branc et al., discloses a disc drive isolation system including an environmental control involving a thermoelectric heat pump and fan. Temperature and humidity sensors located near the disk drive actuate the heat pump to regulate the thermal conditions inside the cabinet. Similarly, Koneko et al. discloses the use of a cooling system to cool electronic devices housed within a hermetically closed chamber.

Cabinetry featuring environmental control systems like those disclosed in Branc et al. and Koneko et al., are expensive to buy and costly to maintain. More importantly, these systems, in themselves, create new risks that a data storage device stored within the cabinetry will be damaged resulting in lost data. Because these cabinets require active thermal regulation to control temperatures in the area surrounding the storage device, a loss of that active thermal regulation will result in increased temperatures and damage to the storage media. It is only possible to avoid such a result, when using these cabinets through exceptional maintenance and service practices, or by designing a system that automatically shuts down if the temperature exceeds a set limit. This latter alternative is unacceptable in real time business systems.

Kikinis, U.S. Pat. No. 5,623,597 presents two alternative systems, an "active" system and a "passive" system, for protecting a data storage device. In the "active" system, a data storage device is mounted onto a heat sink structure within a fireproof enclosure. A heat transfer system involving a radiator is connected to the heat sink and circulates a coolant through the wall of the fireproof enclosure. A thermostat controller is mounted on the outside of the wall to disable the heat transfer system in the event of a fire.

In the "passive" system, a data storage device is similarly attached to a heat sink. In this system, however, thermal-insulating material has a gap that permits the heat sink to be urged into contact with the exterior metal surface of the cabinet by a set of springs. This allows for the discharge of the heat generated by the data storage device during normal operation. If the thermostat detects fire, it releases a pressurized liquid insulting material into the space between the metal surface and the heat sink. This separates the heat sink from the metal surface of the fire-resistant computer storage apparatus and provides a degree of insulation.

Both embodiments of the Kikinis system create a risk of failure in that the key thermal management component, the thermostat may fail. In the event of a failure of the thermostat, heat from a fire will be conveyed directly to the data storage device. This will be likely to have catastrophic consequences for the data storage device.

In addition, the "passive" embodiment of this system involves the increased risk of failure associated with the use of a pressurized insulation injection system that must stay fully charged until it is necessary to activate. Alternative versions of this "passive" embodiment include the use of electrical, mechanical, and electromechanical means to separate the heat sink from the metal exterior of the fire-resistant computer storage apparatus. All of these systems have the potential to fail to operate, particularly if they are unused for a period of months or years. To lower these risks, the thermostat, heat transfer system, insulation injection system, and separation means must also be maintained and tested periodically. Thus, what is needed is a cabinet to protect an operational data storage device that is fully passive, requires no maintenance, yet provides adequate thermal protection.

A second technical challenge confronting the designers of such a cabinet is the challenge of permitting electrical and data cables to pass through the insulation without compromising the thermal integrity of the data storage device. There are two ways in which this thermal integrity can be compromised. First, most electrical and data cables are made of metal materials because of their electrical conductivity. However, the metal used in these cables tends to also be a good thermal conductor. Thus, there exists the risk that the cables will become heated by exposure to a fire outside of the cabinet and will convey this heat to damage a data storage device located within the cabinet. Second, the passageway itself can provide a pathway permitting the entry of heated gasses.

Branc et al., Koneko et al. and Kikinis all inherently require that electrical and data cables have a passageway from the exterior of the cabinet into the thermally protected area about the electronic storage device. However, these fail to identify any method for protecting the data storage device from the risks of thermal damage associated with the cables and passageway.

Thus, what is needed is a system that is fully passive, requires no maintenance, provides adequate thermal protection for a stored data device and provides an entry for passing electrical and data cables through the thermal insulation without exposing the data storage device to an enhanced risk of thermal damage created by externally heated data cables of gasses.

SUMMARY OF THE INVENTION

In accordance with the present invention, a thermally insulated cabinet is provided for protecting electronic data storage devices from damage by accidental and environmental conditions and from intentional acts. This cabinet provides an interior envelope which contains a data storage device surrounded by multiple layers of thermal insulation. The thermal insulation layers allow electrical power, data and device control cabling to access the device, thus permitting real time operation of the device while the device is contained within the inner envelope.

The inner envelope has two vertically separated ends: a lower end and an upper end. The data storage device is positioned at the lower end of the inner envelope to permit heated air to rise from the lower end of the inner envelope away from the location of the device. The inner envelope is dimensioned to permit the heat generated by operation of the data storage device to dissipate and to maintain stable thermal conditions within the inner envelope during normal use.

The formation of the convection pathway within the inner envelope provides a truly passive means for the heat generated by operation of the data storage unit to dissipate without risking damage to the data storage unit in the event of an external fire. Accordingly, this device solves the first design challenge faced by the designers of protective enclosures for data storage devices by providing a means to dissipate the heat generated by the data storage device while still enclosing the device within a sealed protection thermal insulator.

To maximize the capacity of the thermal insulation to absorb external heat, an inner layer of thermal insulation is composed of a phase change material. In extreme temperature situations, this phase change material absorbs additional thermal energy by transitioning from a solid to a liquid.

The tortuous path through the thermal insulation is provided to accommodate various electrical power, data, and control cables that must be connected to the device to permit to the data storage device to function. In one embodiment, a serpentine path is provided for the cables. The serpentine path substantially increases the thermal energy that can by released by the control wires into the thermal insulators and reduces the risk that these wires will conduct sufficient thermal energy from the outside of the cabinet to damage the data storage device.

Alternatively, the thermal insulators can be designed to accept a thermoplastic preform having a tortuously directed passageway extending through the preform. This preform can be formed to permit external insertion of the data, power and control cables into the tortuously directed passageway. The preform may also be designed to permit partial disassembly and thereby to facilitate insertion of the cables. In certain applications, it may be necessary to manufacture the preform from an intumescent material.

Accordingly, this device solves the second design challenge, namely, providing an effective and thermally insulated pathway to permit the electric, data and control cables to pass through the thermal insulation layers to permit real time use of the data storage device.

Additional features of the present invention will become apparent to those skilled in the art upon considering the following description of a preferred embodiment of the present invention that exemplifies the best mode of carrying out the invention.

DETAILED DESCRIPTION OF THE PREFERRED EMBODIMENT

Figure 1:
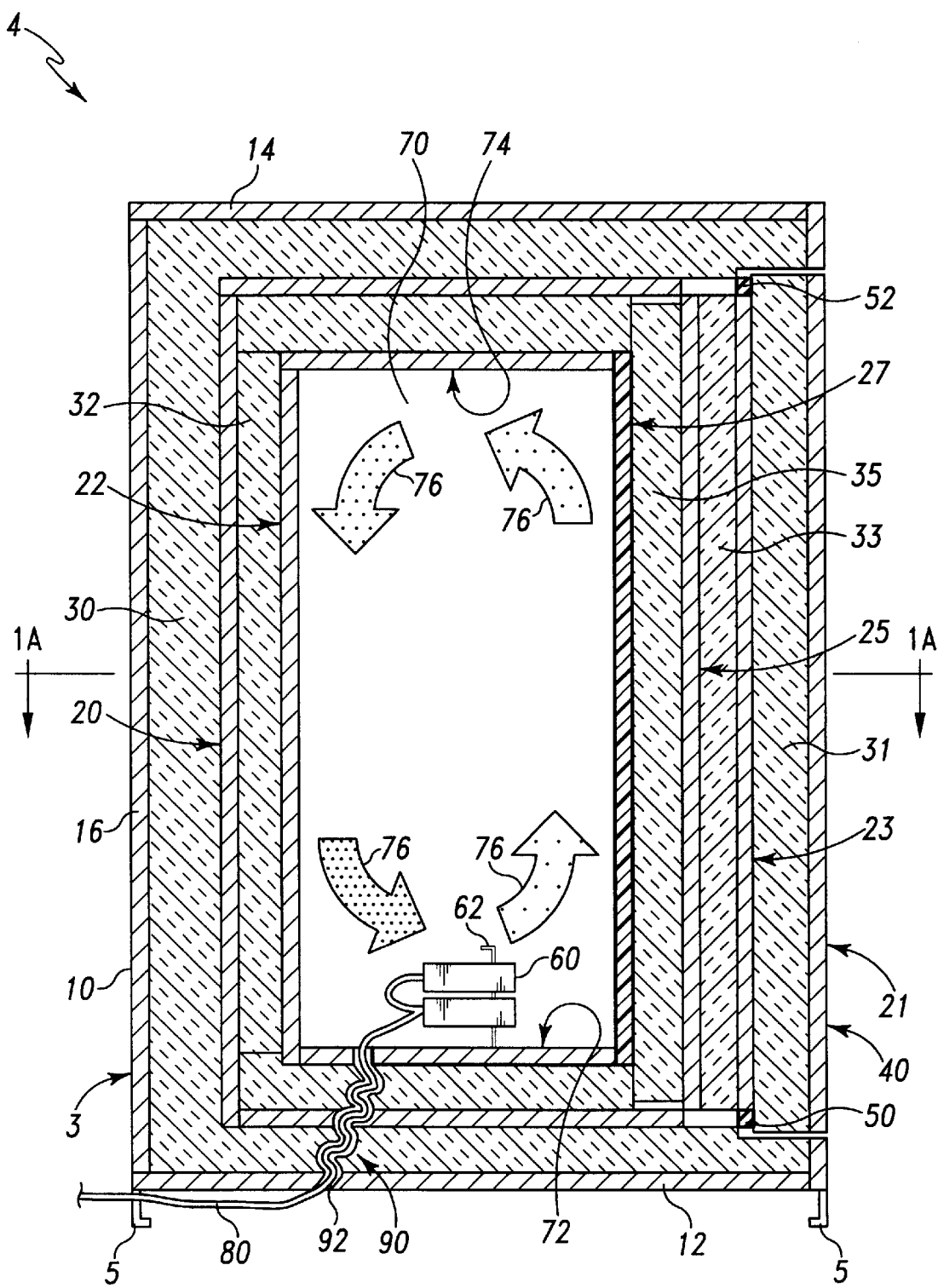
FIG. 1 is a cross sectional view of a cabinet of the present invention.
Figure 1A:
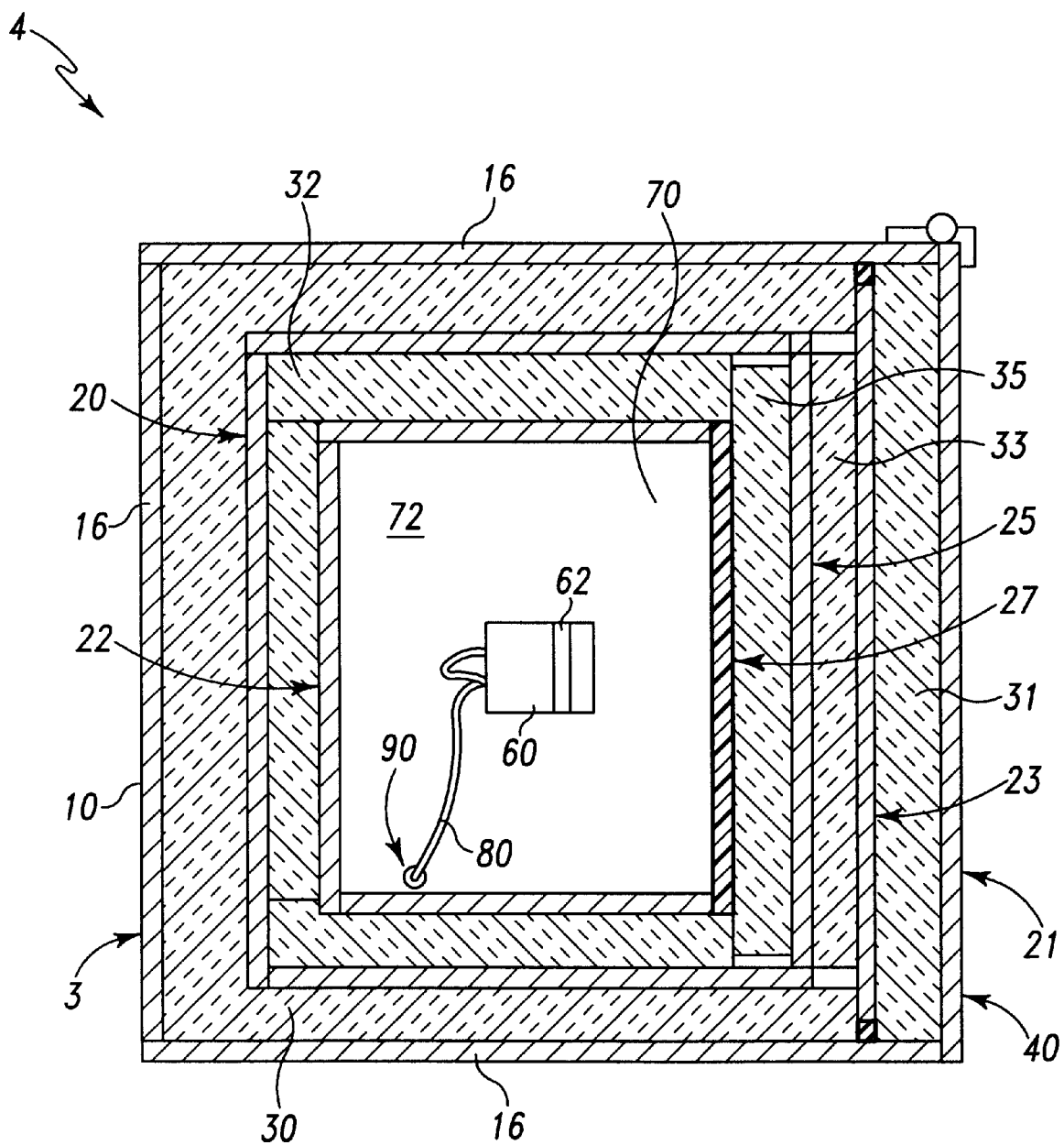
FIG. 1A is a cross sectional view taken along line 1A—1A of FIG. 1.

FIG. 1 and FIG. 1A illustrate a cabinet 4 of the present invention. In this invention an insulated shell 3 is fixed to and rests upon a base 5. The shell 3 includes an outer metal envelope 10 comprising a metal floor 12, and a top 14 separated from the floor by three walls 16. An intermediate metal envelope 20 is spaced substantially uniformly from the outer metal envelope 10 and a first layer of insulation 30 is deposited between the outer metal envelope 10 and the intermediate metal envelope 20. An inner metal envelope 22 is spaced substantially uniformly from the intermediate metal envelope 20 and a second layer of insulation 32 is disposed between said intermediate metal envelope 20 and said inner metal envelope 22.

A door 40 is fixed to the cabinet and forms a substantial portion of a fourth wall of the cabinet 4. The door 40 is shaped for engagement with the shell 3 and is permitted to move relative to the shell 3 to permit manual access to the computer data storage device 60 within the shell 3. The door 40 is comprised of an outer metal shell 21, a first insulation layer 31, that is disposed between the outer metal shell 21 and the intermediate metal envelope 23; a second insulation layer, 33 that is disposed between the first insulation layer 31; and a second intermediate metal envelope 25, and a third insulation layer 35, that is disposed between the second intermediate metal envelope 25 and an inner plastic envelope 27.

The door 40 features seals 50 and 52 to prevent gasses from entering the cabinet 4 by way of the connection between the door 40 and the shell 3.

When door 40 is closed, the inner metal envelopes 22 and inner plastic envelope 27 form a sealed and thermally insulated interior chamber 70. Chamber 70 has a lower end 72, and upper end 74 and a convection pathway 76 disposed between the lower end 72 and the upper end 74. Data storage device 60 is secured within chamber 70 to by rack 62 protect the data storage device 60 from external thermal and environmental damage. In one preferred embodiment, FIG. 1, the data storage device is positioned proximate to the lower end 72 of the chamber 70. In another preferred embodiment, FIG. 2, the data storage device is positioned proximate to the upper end 74 of the chamber 70.

When the data storage device 60 is activated, it generates heat. This heat is radiated into the air within the sealed and thermally insulated interior chamber 70. The heated air in chamber 70 rises and is displaced, at the lower end 72 of chamber 70 by cooler air. The heated air then passes along the convection pathway radiating thermal energy into the thermal insulation. In a preferred embodiment of this invention, the convection pathway 74 is sized relative to the thermal load generated by the data storage device 60 to permit dissipation of the thermal energy generated by the data storage device 60. As this thermal energy is dissipated, the air cools and is displaced at the upper end 74 of chamber 70 with heated air. This creates a convection effect that over time maintains the air at the data storage device 60 at a steady temperature.

Insulation layers 30, 31, 32, 33, and 35 are composed of various materials having a low degree of thermal conductivity. In one preferred embodiment, insulation layers 30 and 31 are composed of composite insulation, while insulation layers 32, 33, and 35 are composed of an insulator made from urethane foam. Together they have a thermal conductivity of between about 0.021 and 0.063 W/m° K.

In each of the preferred embodiments, the protective function of the cabinet 4 is provided by means of the layers of insulation 30, 31, 32, 33, and 35 in the door 40 and the shell 10. These layers have a composite thermal conductivity and thermal capacity calibrated to thermally isolate the data storage device 60 and any medium contained in the computer storage device 60 from external temperature extremes for a minimum of at least one hour. In each of these embodiments, cabinet 4 is also sufficiently conductive to provide an outward thermal energy transfer rate sufficiently rapid enough to allow dissipation of thermal energy generated by operation of storage device 60 within the cabinet under normal operating conditions.

Meeting both of these sets of requirements is difficult. The ability of solid materials to conduct thermal energy is a function of many factors. As noted above, two key factor are the thermal conductivity and thermal capacity of the material through which the heat is to be transferred. Other key factors include the time period allowed for the transfer of the thermal energy, the difference between the temperatures on each side of the material and the amount of surface area of the material exposed to the heat source.

To provide sufficient protection of the data storage device 4, the cabinet 4 of the present invention must protect the data storage device from damage when the cabinet is exposed to extreme external temperatures for a period of at least one hour. Thus, the protective function of the cabinet 4, inherently requires the designer to select insulative materials 30, 31, 32, 33, 35 for the cabinet 4 based upon several defined factors: the external surface area of the cabinet, the expected temperature differential and the requirement that the cabinet 4 protects the data storage device 60 for a period of at least one hour.

The designer must also consider the thermal capacity of the insulators when selecting the material to be used as an insulator. This is in part because the thermal conductivity of the thermal insulator is partially dictated by the temperature of the material and in part because the material itself is not a perfect thermal conductor and will retain part of the thermal energy that it is exposed to. Some materials are even selected for use as thermal insulators because they change state when exposed to certain thermal conditions. These insulators are known as endothermic materials. Such insulators are of particular value when used to provide protection for extreme events such as fire because they absorb substantial amounts of thermal energy during their transition between states. In practice, it has been found that endothermic materials having a phase change temperature in the range between 33° C. and 55° C. are preferred. Examples of such materials include waxes, salts, borax and anhydrous soda ash.

Figure 2:
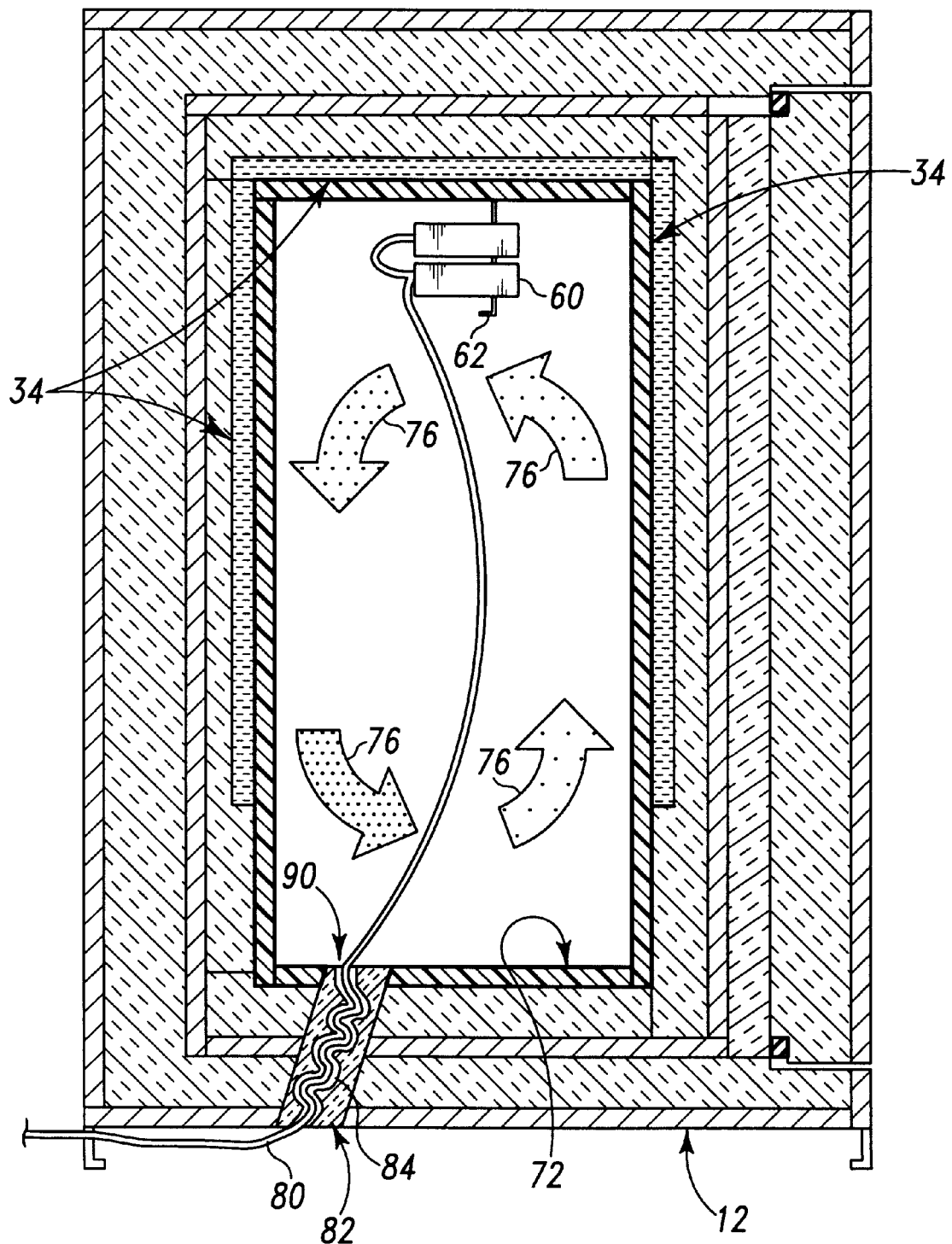
FIG. 2 is a cross sectional view of a cabinet of the present invention using a preform and the data storage devices is elevated.

One preferred embodiment of this invention, as shown in FIG. 2, utilizes a layer of wax 34 to provide additional thermal capacity. In this embodiment, the salts are positioned between the intermediate metal envelope 20 and the inner metal envelope 22 of the shell 3 and between the second intermediate metal envelope 25 and the inner metal envelope 27. The wax 34 is carefully selected to absorb energy by changing states from the solid state to the liquid state when confronted with extreme temperatures approximating 314° K (about 105° F.) The wax 34 is encased to restrain the wax during its liquid phase.

Once the insulation has been selected to match the overall size of the exterior of the cabinet, the expected time of exposure to external heat extremes and the expected thermal difference during an extreme event such as a fire, there appears to be no room for the inventor to further define the cabinet 4 to effectively and passively dissipate the heat generated by the operation of a data storage device 60 within the cabinet 4. This appearance is incorrect.

The present invention accommodates both the protective function and the passive heat discharge function of the device without compromising either. It is understood that the same thermal equations that govern the thermally protective functions of the cabinet 4, also govern the capability of the cabinet 4 to discharge thermal energy created within the inner envelope 70 of the cabinet 4. Although the thermal characteristics of the insulation 30, 31, 32, 33, and 35 are and must be defined to provide thermal protection for the contents of this cabinet, these characteristics merely establish the rate at which thermal energy can be dissipated from within the inner chamber 70 and the capacity of the various layers of insulation to absorb such thermal energy.

The total amount of thermal energy that may be dissipated from within the inner chamber 70 is not a function of thermal conductivity and capacity alone, but rather two other factors as well, the temperature gradient and the surface area to which such thermal energy is exposed for dissipation.

By increasing the internal surface area of the interior chamber 70 the cabinet 4 is given greater capacity for dissipating thermal energy from the inner chamber 70. Further, by increasing the thermal gradient, that is the temperature differential between the inner chamber 70 and the ambient temperature outside of the cabinet 4, the amount of thermal energy dissipated across the thermal insulators 30, 31, 32, 33, and 35 can also be increased. By carefully sizing the top surface 74 and convection pathway 76 of the inner envelope 70 relative to the amount of energy to be dissipated and the insulative characteristics of the cabinet 4 it is possible to provide cabinet 4 that will have both the dissipative and protective functions. Importantly, it has been found that the protective function is not compromised by an increase in the surface area of the surfaces of the interior chamber 70.

In a preferred embodiment of this invention, the cabinet 4 having an external surface area of 2.36 m$^2$ combines insulation layers 30 and 31 having a thermal conductivity between 0.06 W/m° K and 0.07 W/m° K with insulation layers 32, 33, 34, and 35 having a thermal conductivity between 0.015 W/m° K and 0.025 W/m° K to limit the thermal conductivity of the device. The materials used in these layers are further selected to have a minimum thermal capacity of 15 Watts. In another preferred embodiment, the insulative materials 30, 31, 32, 33, and 35 may be selected to include state changing materials to provide additional thermal protection for a data storage device 60 located within the inner chamber 70.

However, to permit adequate dissipation of the thermal energy created by the operation of a data storage device 60 generating 2.5 joules of thermal energy per second within the interior chamber 70, the interior chamber 70 is defined to provide a surface area sufficient to permit this energy to be dissipated through the layers of insulation despite the low rate of thermal conductivity. In practice it has been found that a minimum of 0.60 m$^2$ are necessary to support such a device.

The first law of thermodynamics provides that thermal energy will flow across a medium from a surface having an elevated temperature toward a surface having a lower temperature. Accordingly, if the temperature within the inner chamber 70 is not elevated above room temperature on the exterior of the cabinet 4, no heat will be dissipated. In practice, it has been found useful to size the convection pathway 76 to allow for the creation of a temperature differential between the interior chamber 70 and the exterior of the cabinet 4. In one preferred embodiment, this differential is set approximately 12° C., above an anticipated ambient temperature of 20° C. This differential is obtained by sizing the surface area of the interior chamber so that only a calibrated amount of thermal energy is dissipated from within the inner envelope per unit of time. This calibration causes internal temperatures within the inner envelope to rise until an equilibrium is reached.

To allow electrical, communications and data cables 80 to enter the cabinet 4, the metal floor 12 of the outer metal envelope 10, the first layer of insulation 30, the intermediate metal envelope 20, the second layer of insulation 32, and the inner metal envelope 22 provide a tortuous pathway 90 extending from the metal floor 12 and into the inner metal envelope 22. This pathway 90 can be formed with tight tolerances to form a seal about the cables 80. Alternatively, the pathway 90 can be oversized with respect to the cables to facilitate insertion of the cables 80 through the pathway 90. In this alternative embodiment, the pathway can be sealed by the introduction of a thermally resistant sealant 92 or an intumescent material.

As is shown in FIG. 2, the pathway 90 between the metal floor 12 and the inner envelope 22 can be formed to accept a thermoplastic preform 82. This preform has an exterior for mating with the shell 3, and a serpentine shaped interior 84 to accept and hold cables 80. This will allow external insertion of the cables 80 into the preform 82, facilitating assembly of the preform 82 with the pathway 90. In an alternative embodiment, the preform 82 can be formed to permit partial disassembly in order to accept insertion of the cables 80 into the preform 82. In another alternative embodiment, the preform 82 can be formed from an intumescent material.

In normal operation, door 40 is closed creating a closed and sealed thermal environment in chamber 70. The data storage device 60 is positioned from the upper end 74 of chamber 70 and is connected to cables 80. Alternatively, the data storage device 60 can be positioned from the lower end 72 of the chamber 70. As the data storage device 60, functions, air surrounding the data storage device 60 is heated. This heated air rises along the convection pathway 76, and releases energy into the inner envelopes of the door 27 and the cabinet 4. The convection pathway 76 is formed and the insulation layers 30, 31, 32, 33, 34 and 35 are selected so that the energy generated by operation of the data storage device 60 can be dissipated through the insulation layers 30, 31, 32, 33, 34, and 35 and eventually through the outer metal shells of the door 21 and the outer metal shell 10 of the cabinet 4. Accordingly, a stable thermal environment is created within the cabinet by dissipating the thermal energy created by the data storage device 60 through these mechanisms.

In the event of a fire, the data storage device 60 is protected from heat and direct flame impingement damage by the multiple layers of insulation 30, 31, 32, 33, 34, and 35. The tortuous path 90 protects the data storage device 60 from damage caused by heat conveyed by the cables 80.

What is claimed is:

1. A fire-resistant cabinet for containing at least one computer storage device, the cabinet comprising:
   a base,
   an insulated shell fixed to the base, the shell forming a floor, three walls and top of the cabinet and including an outer metal envelope, an intermediate metal envelope spaced substantially uniformly from the outer metal envelope, a first layer of insulation between the outer and intermediate metal envelopes, an inner metal envelope spaced substantially uniformly from the intermediate metal envelope, and a second layer of insulation between the intermediate and inner metal envelopes,
   a rack fixed within the inner metal envelope for holding said at least one computer storage device,
   a tortuous path extending through the metal envelops and layers of insulation in the floor for receiving a plurality of electrical conductors reaching through the floor between the rack and the base to provide connection with a computer situated outside the cabinet,
   a door forming a substantial portion of a fourth wall sealing the door to the shell when in a closed position, the door including at least an outer and an intermediate metal layer, a first layer of door insulation between the outer and intermediate metal layers, an inner door surface layer and at least one layer of insulation separating the inner door surface layer from the intermediate metal layer,
   the layers of insulation in the door and shell being sufficiently thermally conductive to provide an outward thermal energy transfer adequate to allow enough dissipation of waste thermal energy from any computer storage device operating within the cabinet to permit continuous operation of the computer storage device even when the door is closed, and
   the layers of insulation in the door and shell being sufficiently thermally isolating in the event of a fire to protect the computer storage device and any medium contained therein for a minimum of at least one-hour.

2. The fire-resistant cabinet of claim 1, wherein the thermal conductivity of the first layer of insulation in the door is between 0.060 W/m° K and 0.070 W/m° K and the thermal conductivity for the second layer of installation and the second layer of insulation separating the inner door surface layer from the intermediate metal layer is between 0.015 W/m° K and 0.025 W/m° K.

3. The fire-resistant cabinet of claim 2, wherein said inner envelope further comprises an interior surface with said interior surface presenting sufficient surface area to permit transfer of heat from the inner envelope at a rate that stabilizes the temperature of the inner envelope during normal operation.

4. The fire-resistant cabinet of claim 3, wherein said inner envelope has two vertically separated ends, a lower end and an upper end.

5. The fire-resistant cabinet of claim 4, wherein said inner envelope forms a convection pathway between the lower end and the upper end to permit heated air to rise from the lower end of the inner metal envelope and to cool.

6. The fire-resistant cabinet of claim 5, wherein the separation of the lower end and upper end of the inner envelope is defined to provide stable thermal conditions within the inner envelope under normal operating conditions.

7. The fire-resistant cabinet of claims 1, 2 or 6, wherein the rack is affixed to the lower end of the inner envelope.

8. The fire-resistant cabinet of claims 1, 2, or 6, wherein the rack is affixed to the upper end of the inner envelope.

9. The fire-resistant cabinet of claim 1, further comprising a layer of an endothermic material disposed between the inner layer and the intermediate layer to change state as necessary to absorb heat.

10. The fire-resistant cabinet of claim 1, further comprising a layer of an endothermic material having a phase change between the temperature ranges of 33° C. and 55° C.

11. The fire-resistant cabinet of claim 1, Wherein said tortuous path comprises a serpentine pathway through said layers.

12. The fire-resistant cabinet of claim 1, wherein said tortuous path comprises a thermoplastic preform having a tortuously directed passageway extending through the preform.

13. The fire-resistant cabinet of claim 1, wherein said tortuous path comprises a intumescent preform having a tortuously directed pathway extending through the preform.

14. A fire-resistant cabinet for containing at least one computer storage device, the cabinet comprising:
    a base,
    an insulated shell fixed to the base, the shell forming a floor, three walls and top of the cabinet and including an outer metal envelope, an intermediate metal envelope spaced substantially uniformly from the outer metal envelope, a first layer of insulation between the outer and intermediate metal envelopes, an inner metal envelope spaced substantially uniformly from the intermediate metal envelope, and a second layer of insulation between the intermediate and inner metal envelopes,
    the inner metal envelope having a lower end and an upper end vertically separated to define a convection pathway between the lower end and the upper end with sufficient surface area to permit the transfer of heat from the inner envelope at a rate that stabilizes the temperature of the inner envelope during normal operations,
    a rack fixed within the inner metal envelope for holding said at least one computer storage device, a tortuous path extending through the metal envelops and layers of insulation in the floor for receiving a plurality of electrical conductors reaching through the floor between the rack and the base to provide connection with a computer situated outside the cabinet, a door forming a substantial portion of a fourth wall sealing the shell when the door is in a closed position, the door including at least an outer and an intermediate metal layer, a first layer of door insulation between the outer and intermediate metal layers, an inner door surface layer and at least one layer of insulation separating the inner door surface layer from the intermediate metal layer, and the layers of insulation in the door and shell being sufficiently thermally isolating in the event of a fire to protect the computer storage device and any medium contained therein for a minimum of at least one-hour.

15. The fire-resistant cabinet of claim 14 wherein the thermal conductivity of the first layer of insulation in the door is between 0.060 W/m° K and 0.070 W/m° K and the thermal conductivity for the second layer of installation and the second layer of insulation separating the inner door surface layer from the intermediate metal layer is between 0.015 W/m° K and 0.025 W/m° K.

16. A fire-resistant cabinet for containing at least one computer storage device, the cabinet comprising:

a base, an insulated shell fixed to the base, the shell forming a floor, three walls and top of the cabinet and including an outer metal envelope, an intermediate metal envelope spaced from the outer metal envelope, a first layer of insulation between the outer and intermediate metal envelopes, an inner metal envelope spaced from the intermediate metal envelope, and a second layer of insulation between the intermediate and inner metal envelopes, a rack fixed within the inner metal envelope for holding said at least one computer storage device, a tortuous path extending through the metal envelops and layers of insulation in the floor for receiving a plurality of electrical conductors reaching through the floor between the rack and the base to provide connection with a computer situated outside the cabinet, a door forming a substantial portion of a fourth wall sealing the door to the shell when in a closed position, the door including at least an outer and an intermediate metal layer, a first layer of door insulation between the outer and intermediate metal layers, an inner door surface layer and at least one layer of insulation separating the inner door surface layer from the intermediate metal layer, the layers of insulation in the door and shell being sufficiently thermally conductive to provide an outward thermal energy transfer adequate to allow enough dissipation of waste thermal energy from any computer storage device operating within the cabinet to permit continuous operation of the computer storage device even when the door is closed, and the layers of insulation in the door and shell being sufficiently thermally isolating in the event of a fire to protect the computer storage device and any medium contained therein for a minimum of at least one-hour.

17. The fire-resistant cabinet of claim 16, wherein said inner envelope further comprises an interior surface with said interior surface presenting sufficient surface area to permit transfer of heat from the inner envelope at a rate that stabilizes the temperature of the inner envelope during normal operation.

18. The fire-resistant cabinet of claim 16, further comprising a layer of an endothermic material disposed between the inner layer and the intermediate layer to change state as necessary to absorb heat, the endothermic material having a phase change between the temperature ranges of 33° C. and 55° C.

19. The fire-resistant cabinet of claim 16, wherein the cabinet has an external surface area of about 2.36 $m^2$, said first insulation layers have a thermal conductivity between about 0.06 W/m° K and 0.07 W/m° K and said second insulation layers have a thermal conductivity between about 0.015 W/m° K and 0.025 W/m° K, and said insulation layers are further selected to have a minimum thermal capacity of about 15 Watts.

\* \* \* \* \*